US012575284B2

(12) United States Patent (10) Patent No.: US 12,575,284 B2
Huang et al. (45) Date of Patent: Mar. 10, 2026

(54) DISPLAY PANEL WITH TRANSPARENT AREAS HAVING IMPROVED TRANSMITTANCE, AND ELECTRONIC DEVICE COMPRISING THE SAME

(71) Applicant: WUHAN CHINA STAR OPTOELECTRONICS SEMICONDUCTOR DISPLAY TECHNOLOGY CO., LTD., Wuhan (CN)

(72) Inventors: Can Huang, Wuhan (CN); Zhongming Chen, Wuhan (CN); Na Liu, Wuhan (CN); Hui Zheng, Wuhan (CN); Shengze Liu, Wuhan (CN); Wenxu Xianyu, Wuhan (CN); Chunpeng Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 642 days.

(21) Appl. No.: 17/759,846

(22) PCT Filed: Jul. 13, 2022

(86) PCT No.: PCT/CN2022/105527
§ 371 (c)(1),
(2) Date: Jul. 29, 2022

(87) PCT Pub. No.: WO2024/000663
PCT Pub. Date: Jan. 4, 2024

(65) Prior Publication Data
US 2024/0188365 A1 Jun. 6, 2024

(30) Foreign Application Priority Data
Jun. 30, 2022 (CN) .......................... 202210768560.6

(51) Int. Cl.
*H10K 59/35* (2023.01)
*H10K 59/122* (2023.01)
(Continued)

(52) U.S. Cl.
CPC ......... *H10K 59/353* (2023.02); *H10K 59/122* (2023.02); *H10K 59/127* (2023.02); *H10K 59/873* (2023.02)

(58) Field of Classification Search
CPC .. H10K 59/353; H10K 59/122; H10K 59/127; H10K 59/873; H10K 59/00; H10K 59/844
See application file for complete search history.

(56) References Cited

U.S. PATENT DOCUMENTS

2021/0280825 A1* 9/2021 Beon ....................... H10K 59/60
2021/0335955 A1* 10/2021 Son ....................... H10K 59/121
(Continued)

FOREIGN PATENT DOCUMENTS

CN 105870146 A 8/2016
CN 109459894 A 3/2019
(Continued)

OTHER PUBLICATIONS

International Search Report in International application No. PCT/CN2022/105527,mailed on Dec. 27, 2022.
(Continued)

*Primary Examiner* — Eliseo Ramos Feliciano
*Assistant Examiner* — Brad A Knudson
(74) *Attorney, Agent, or Firm* — PV IP PC; Peter Stecher; Wei Te Chung

(57) ABSTRACT

A display panel and an electronic device are provided. The display panel includes a first stacked layer and a second stacked layer disposed on a base substrate. Openings are defined on the second stacked layer corresponding to trans-
(Continued)

parent areas, and the openings penetrate the second stacked layer, the first stacked layer, and at least part of the base substrate. The first stacked layer in the transparent areas is removed by forming the openings in the transparent areas. Therefore, transmittance in the transparent areas is improved, thereby solving a problem of poor transmittance in current transparent display screens.

16 Claims, 5 Drawing Sheets

(51) Int. Cl.
*H10K 59/127* (2023.01)
*H10K 59/80* (2023.01)

(56) References Cited

U.S. PATENT DOCUMENTS

| | | | | |
|---|---|---|---|---|
| 2022/0052291 A1* | 2/2022 | Lee | | H10K 50/844 |
| 2022/0140023 A1* | 5/2022 | Jeon | | H10K 59/122 |
| | | | | 257/40 |
| 2022/0173341 A1* | 6/2022 | Bok | | H10K 59/878 |
| 2024/0188411 A1* | 6/2024 | Jia | | H10K 71/135 |

FOREIGN PATENT DOCUMENTS

| | | | |
|---|---|---|---|
| CN | 110767846 | A | 2/2020 |
| CN | 111129078 | A | 5/2020 |
| CN | 113363296 | A | 9/2021 |
| CN | 113540183 | A | 10/2021 |
| CN | 114023764 | A | 2/2022 |
| CN | 114078926 | A | 2/2022 |
| CN | 114512520 | A | 5/2022 |
| CN | 114613923 | A | 6/2022 |
| CN | 114709248 | A | 7/2022 |
| KR | 20190054563 | A | 5/2019 |

OTHER PUBLICATIONS

Written Opinion of the International Search Authority in International application No. PCT/CN2022/105527,mailed on Dec. 27, 2022.

Chinese Office Action issued in corresponding Chinese Patent Application No. 202210768560.6 dated Feb. 17, 2023, pp. 1-10.

* cited by examiner

DISPLAY PANEL WITH TRANSPARENT AREAS HAVING IMPROVED TRANSMITTANCE, AND ELECTRONIC DEVICE COMPRISING THE SAME

FIELD OF INVENTION

The present disclosure relates to the field of display technologies, and more particularly, to a display panel and an electronic device.

BACKGROUND OF INVENTION

With development of display technologies, the emergence of transparent displays has greatly expanded scenes and scopes of display applications. Transparent display screens mean that display screens themselves have a certain degree of transmittance, which can clearly show backgrounds behind the display screens. The transparent display screens are suitable for various application scenarios, such as building windows, car windows, and shop windows. In addition to the original transparent display function, they also have a potential to be used as information displays in the future, so they have attracted attention of markets. However, the transparent display screens also include a plurality of insulating layers and conductive layers formed of different materials, and the existence of these film layers will inevitably affect the transmittance of the transparent display screens.

Technical problem: the present disclosure provides a display panel and an electronic device to solve the technical problem of poor transmittance in current transparent display screens.

SUMMARY OF INVENTION

In order to solve the above problems, an embodiment of the present disclosure provides technical solutions as follows.

An embodiment of the present disclosure provides a display panel, which has pixel areas and transparent areas located between the pixel areas and includes:

a base substrate;

a first stacked layer disposed on the base substrate; and a second stacked layer disposed on one side of the first stacked layer away from the base substrate;

wherein, openings are defined on the second stacked layer corresponding to the transparent areas, and the openings penetrate the second stacked layer, the first stacked layer, and at least part of the base substrate.

In the display panel provided in an embodiment of the present disclosure, each of the openings includes a first sub-hole, a second sub-hole, and a third sub-hole intercommunicated to each other, the first sub-hole penetrates through the second stacked layer, the second sub-hole penetrates through the first stacked layer, and the third sub-hole penetrates through at least the part of the base substrate.

In the display panel provided in an embodiment of the present disclosure, an opening size of one side of the third sub-hole adjacent to the first stacked layer is greater than an opening size of one side of the second sub-hole adjacent to the base substrate.

In the display panel provided in an embodiment of the present disclosure, an opening size of one side of the first sub-hole adjacent to the second sub-hole is greater than an opening size of one side of the second sub-hole adjacent to the first sub-hole.

In the display panel provided in an embodiment of the present disclosure, the base substrate includes a first substrate disposed adjacent to the first stacked layer, the first stacked layer is disposed on the first substrate, and the third sub-hole penetrates part of the first substrate.

In the display panel provided in an embodiment of the present disclosure, the base substrate includes a first substrate and a second substrate, the first stacked layer is disposed on the first substrate, the second substrate is disposed on one side of the first substrate away from the first stacked layer, and the third sub-hole penetrates through the first substrate and exposes part of the second substrate.

In the display panel provided in an embodiment of the present disclosure, the base substrate further includes a first barrier layer disposed between the first substrate and the second substrate, and the third sub-hole penetrates through the first substrate and exposes part of the first barrier layer.

In the display panel provided in an embodiment of the present disclosure, the second stacked layer includes a planarization layer disposed on the first stacked layer and a pixel definition layer disposed on one side of the planarization layer away from the first stacked layer, and pixel openings are defined on the pixel definition layer corresponding to the pixel areas; and the display panel further comprises a light-emitting layer disposed in the pixel openings and an organic auxiliary layer disposed on one side of the light-emitting layer adjacent to the planarization layer, and the organic auxiliary layer further extends into the openings in the transparent areas and is disconnected between the third sub-hole and the second sub-hole.

The display panel provided by an embodiment of the present disclosure further includes:

a first electrode disposed on the planarization layer in the pixel areas, wherein, the pixel openings expose part of the first electrode;

a second electrode disposed on one side of the light-emitting layer away from the first electrode, wherein, the second electrode extends to the transparent areas and is defined with gaps corresponding to the openings; and an encapsulation layer disposed on one side of the second electrode away from the light-emitting layer.

In the display panel provided in an embodiment of the present disclosure, the encapsulation layer includes a first sub-encapsulation layer and a second sub-encapsulation layer disposed in a stack, the first sub-encapsulation layer extends into the openings and covers the organic auxiliary layer, and the second sub-encapsulation layer is filled in the openings.

In the display panel provided in an embodiment of the present disclosure, the display panel further includes a transparent filler filled in the openings, and the encapsulation layer covers the transparent filler.

An embodiment of the present disclosure further provides an electronic device, which includes the display panel in one of the embodiments mentioned above.

Beneficial effect: in the display panel and the electronic device provided in the present disclosure, the display panel has the pixel areas and the transparent areas disposed between the pixel areas, and the display panel further includes the first stacked layer and the second stacked layer disposed on the base substrate. Wherein, the openings are defined on the second stacked layer corresponding to the transparent areas, and the openings penetrate the second stacked layer, the first stacked layer, and at least part of the base substrate. In the present disclosure, the first stacked layer in the transparent areas is removed by forming the openings in the transparent areas. Therefore, transmittance in the transparent areas is improved, thereby solving a problem of poor transmittance in current transparent display screens.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
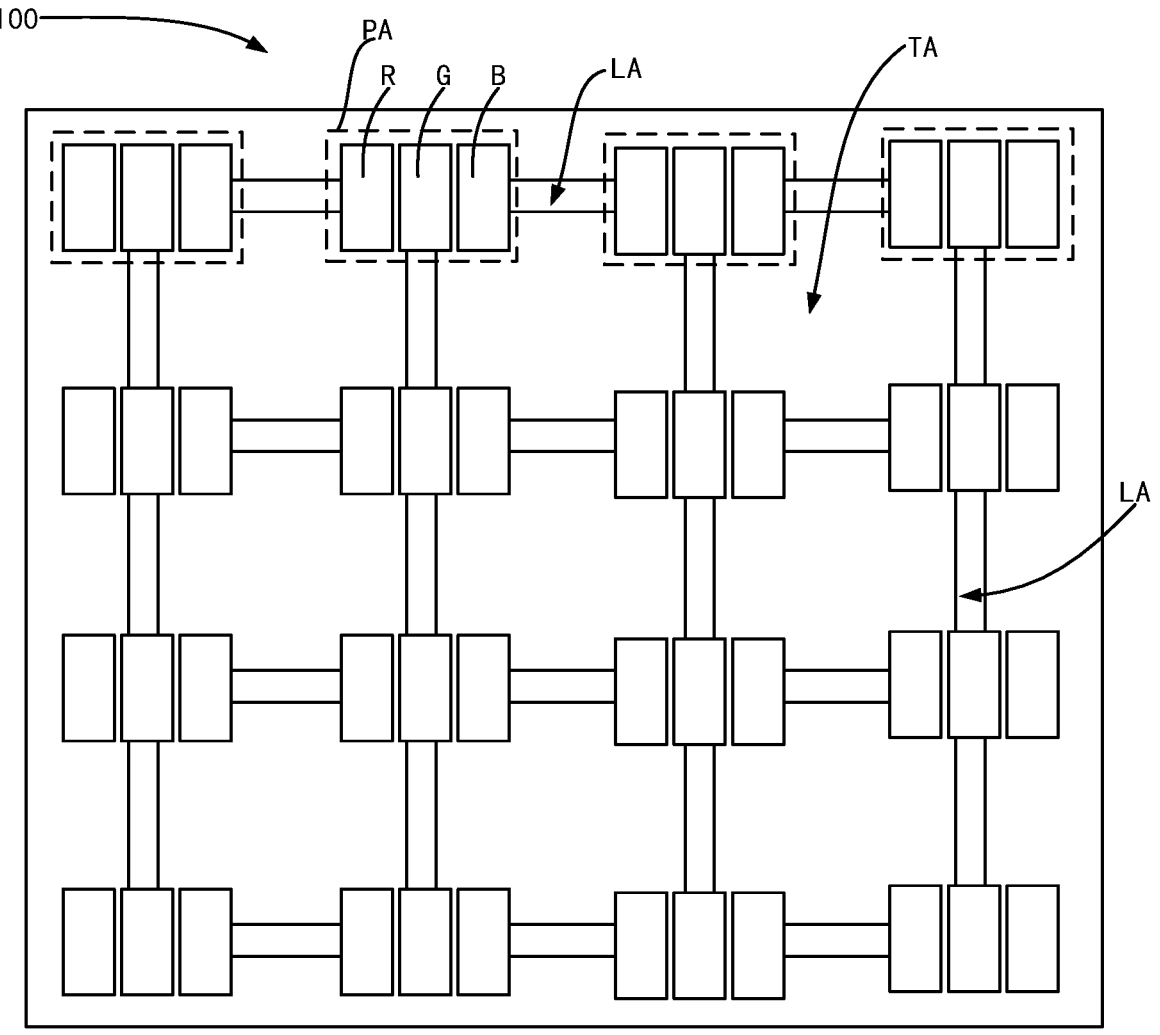
FIG. 1 is a schematic top-view structural diagram of a display panel according to an embodiment of the present disclosure.

The specific embodiments described with reference to the attached drawings are all exemplary and are intended to illustrate and interpret the present disclosure. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. Therefore, the directional terms used are to illustrate and understand the present disclosure, not to limit the present disclosure. The identical or similar reference numerals constantly denote the identical or similar elements or elements having the identical or similar functions in the drawings. In the drawings, the thicknesses of some layers and areas are exaggerated for clarity of understanding and ease of description. That is, the sizes and thicknesses of each component shown in the drawings are arbitrarily shown, and the present disclosure is not limited thereto.

Figure 2:
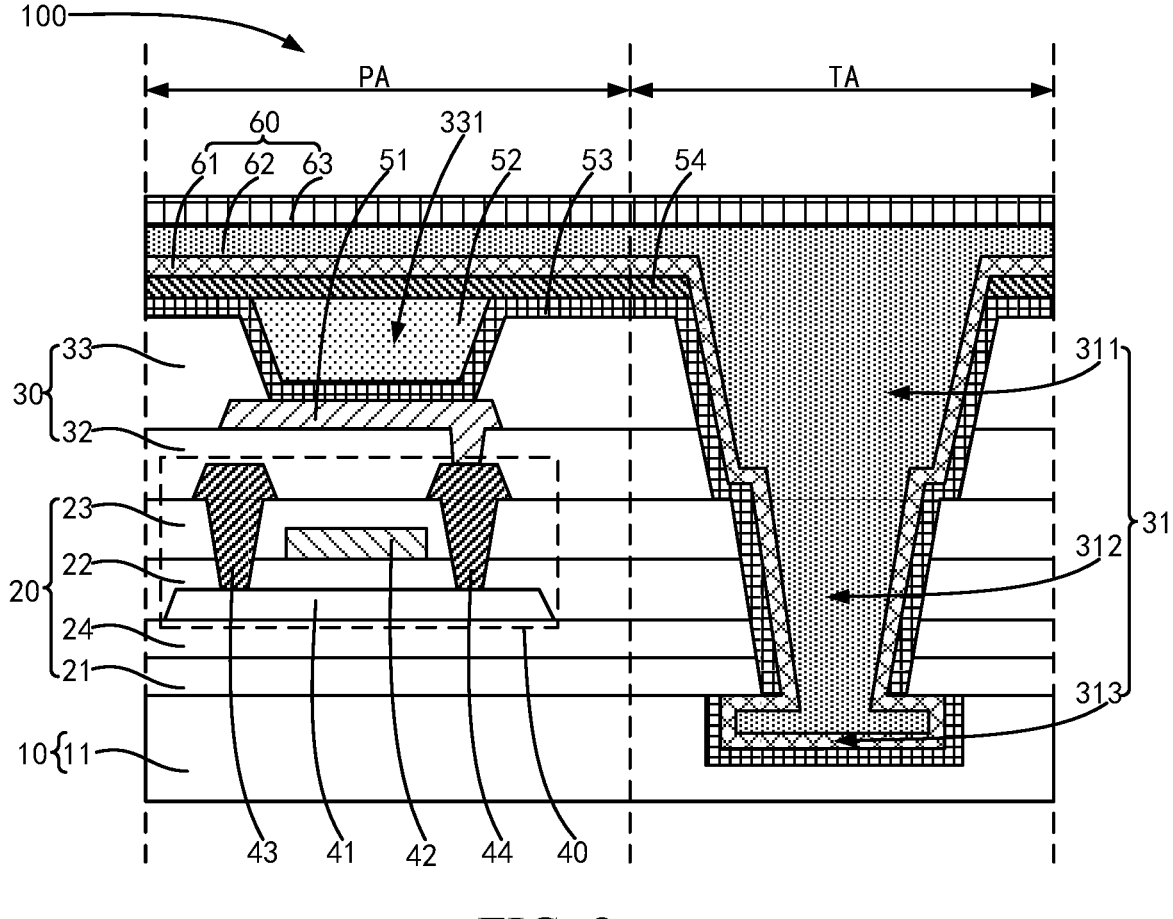
FIG. 2 is a schematic cross-sectional structural diagram of the display panel according to an embodiment of the present disclosure.
Figure 3:
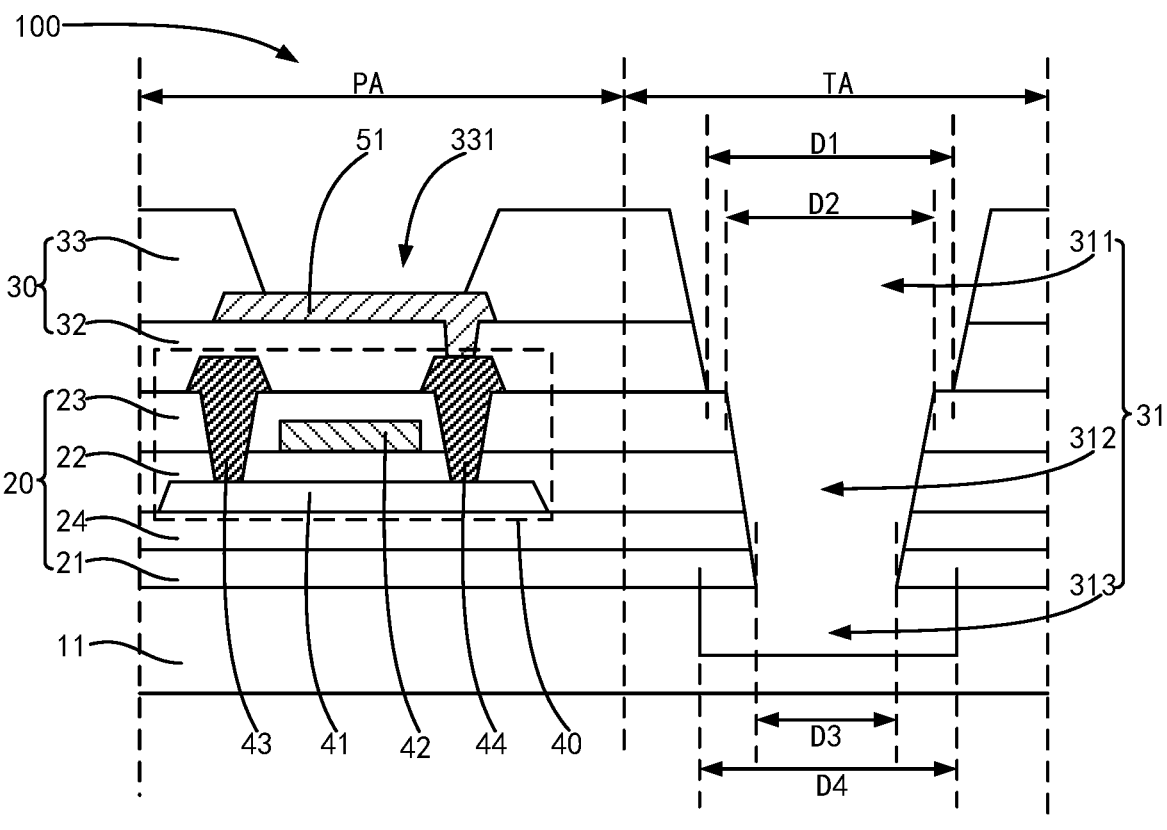
FIG. 3 is a schematic detailed structural diagram of an opening according to an embodiment of the present disclosure.
Figure 4:
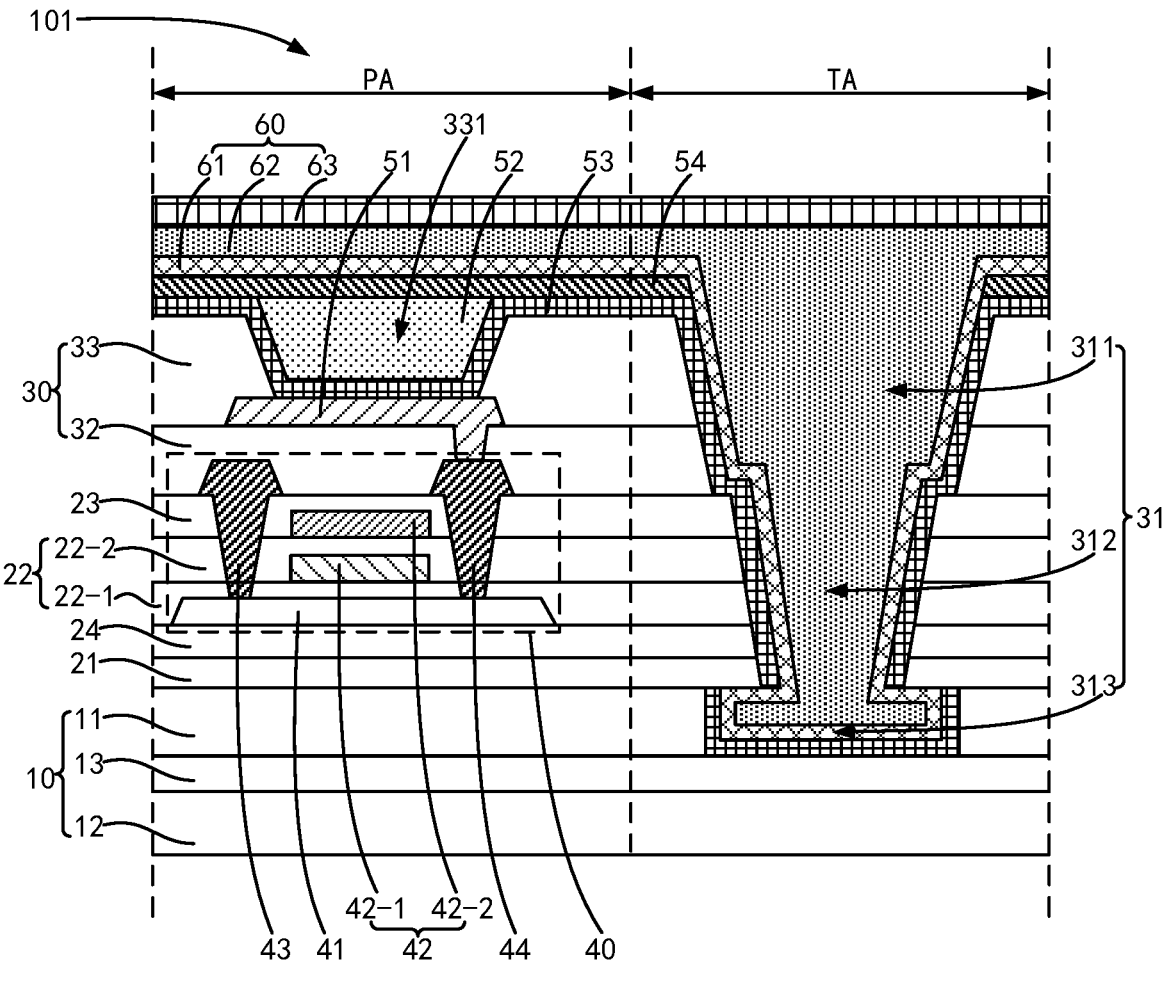
FIG. 4 is another schematic cross-sectional structural diagram of the display panel according to an embodiment of the present disclosure.
Figure 5:
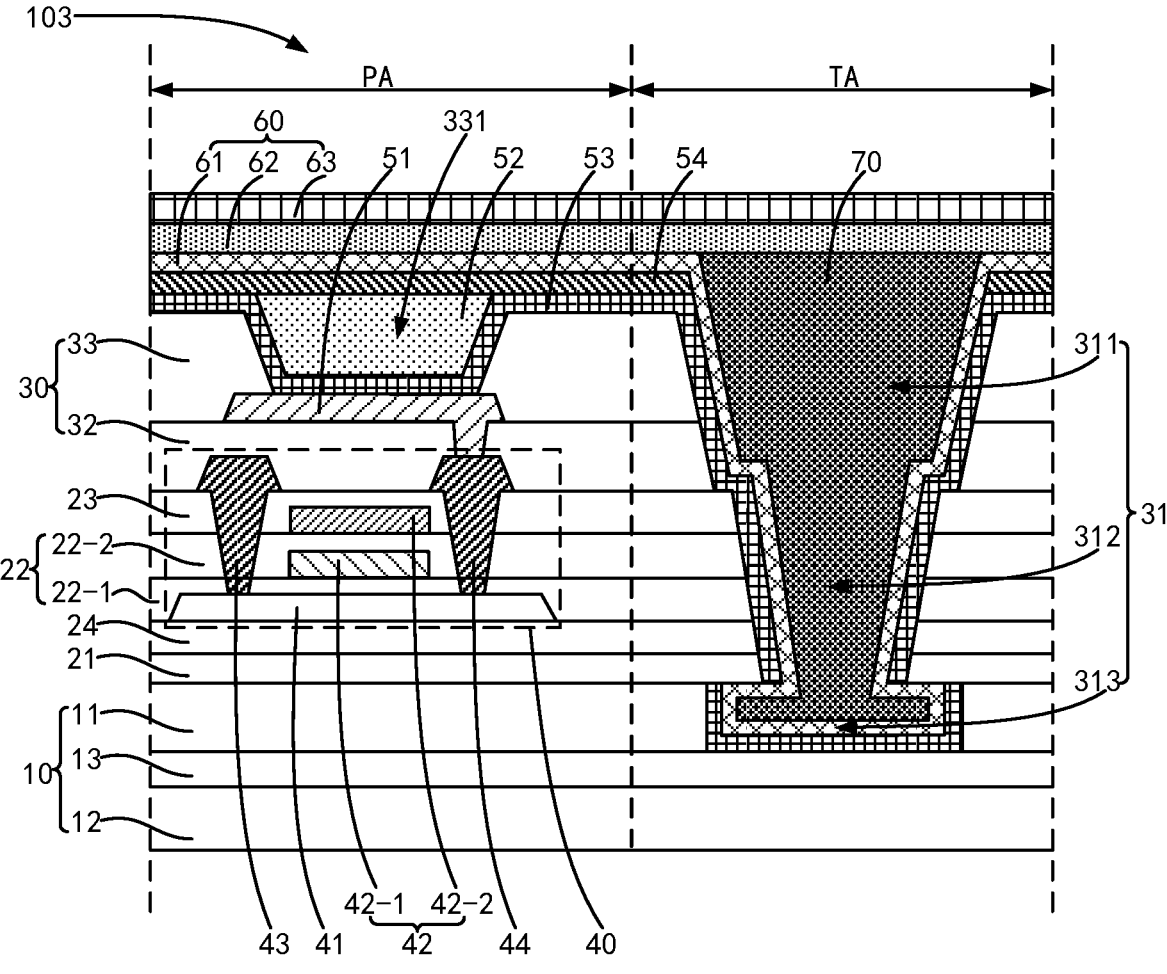
FIG. 5 is yet another schematic cross-sectional structural diagram of the display panel according to an embodiment of the present disclosure.

In conjunction with FIGS. 1 to 3, FIG. 1 is a schematic top-view structural diagram of a display panel according to an embodiment of the present disclosure, FIG. 2 is a schematic cross-sectional structural diagram of the display panel according to an embodiment of the present disclosure, and FIG. 3 is a schematic detailed structural diagram of an opening according to an embodiment of the present disclosure. The display panel 100 includes pixel areas PA and transparent areas TA located between the pixel areas PA, and each of the pixel areas PA includes at least three sub-pixels of different colors, such as a red sub-pixel R, a green sub-pixel G, and a blue sub-pixel B. The transparent areas TA are located between the pixel areas PA, and external ambient light can pass through the transparent areas TA to realize transparent display of the display panel 100. Of course, the display panel 100 further includes wiring areas LA, and the wiring areas LA are provided with signal lines, such as gate scanning lines, data lines, and power lines, for connecting the sub-pixels in each of the pixel areas PA. Specifically, the transparent areas TA are disposed in areas other than the pixel areas PA and the wiring areas LA, so that the transparent areas TA can avoid the wiring areas LA and the pixel areas PA.

Specifically, the display panel 100 further includes a base substrate 10 and a first stacked layer 20 and a second stacked layer 30 disposed on the base substrate 10, and the second stacked layer 30 is disposed on one side of the first stacked layer 20 away from the base substrate 10. Wherein, openings 31 are defined on the second stacked layer 30 corresponding to the transparent areas TA, and the openings 31 penetrate the second stacked layer 30, the first stacked layer 20, and at least part of the base substrate 10. The first stacked layer 20 is an inorganic stacked layer, and the second stacked layer 30 is an organic stacked layer.

The first stacked layer 20 in the transparent areas TA are removed by forming the openings 31 in the transparent areas TA. Therefore, transmittance in the transparent areas TA is improved, thereby solving a problem of poor transmittance in current transparent display screens. It should be noted that the openings 31 penetrating at least part of the base substrate 10 means that the openings 31 penetrating one side surface of the base substrate 10 adjacent to the first stacked layer 20 and extending into the base substrate 10 but not penetrating another side surface of the base substrate 10 away from the first stacked layer 20. That is, the openings 31 do not penetrate through the base substrate 10.

Specific film layer structures of the display panel 100 and a structure of the openings 31 will be described in detail below.

Referring to FIG. 2, the display panel 100 includes the first stacked layer 20 and the second stacked layer 30 disposed on the base substrate 10. Transistors 40 and light-emitting units are disposed on the base substrate 10 in the pixel areas PA, and the transparent areas TA are formed with the openings 31 penetrating the second stacked layer 30, the first stacked layer 20, and a part of the base substrate 10. The transistors 40 are used to drive the light-emitting units to emit light. Each of the light-emitting units includes a first electrode 51, a second electrode 54, and a light-emitting layer 52 and an organic auxiliary layer 53 disposed between the first electrode 51 and the second electrode 54. It should be noted that in FIG. 2, only one sub-pixel in one pixel area PA and one transistor 40 of the one sub-pixel are shown, but the present disclosure is not limited thereto. In the present disclosure, one sub-pixel may include at least two transistors, such as one switch transistor and one drive transistor.

Specifically, both the transistors 40 and the first stacked layer 20 are disposed on the base substrate 10, and the base substrate 10 includes a first substrate 11 disposed adjacent to the first stacked layer 20. Optionally, a material of the first substrate 11 includes flexible film materials, such as polyimide (PI). In order to further improve the transmittance in the transparent areas TA, the material of the first substrate 11 may also be a flexible film material having high transmittance, such as transparent polyimide (Clear polyimide, CPI).

Each of the transistors 40 includes an active layer 41, a gate electrode 42, a source electrode 43, and a drain electrode 44. The first stacked layer 20 includes a second barrier layer 21, a gate insulating layer 22, and an interlayer insulating layer 23 disposed in a stack. The second barrier layer 21 is disposed on the first substrate 11, and the active layer 41 of the transistors 40 is disposed on the second barrier layer 21. The second barrier layer 21 can prevent undesired impurities or contaminants (eg, moisture, oxygen, etc.) from diffusing from the first substrate 11 into devices that may be damaged by these impurities or contaminants. Optionally, a material of the second barrier layer 21 includes inorganic materials, such as silicon oxide (SiOx), silicon nitride (SiNx), or silicon oxynitride (SiON).

Optionally, a buffer layer 24 may also be disposed between the second barrier layer 21 and the active layer 41. The buffer layer 24 can further prevent the undesired impurities or contaminants (eg, moisture, oxygen, etc.) from diffusing from the first substrate 11 into the devices that may be damaged by these impurities or contaminants, and the buffer layer 24 can also provide a flat top surface. A material of the buffer layer 24 may be same as the material of the second barrier layer 21, for example, both may be inorganic materials, such as silicon oxide, silicon nitride, or silicon oxynitride.

The active layer 41 is disposed on the buffer layer 24, and the active layer 41 includes a channel and a source region and a drain region located on both sides of the channel. Optionally, a material of the active layer 41 includes oxide semiconductor materials, such as indium gallium zinc oxide (IGZO), zinc tin oxide (ZTO), or indium tin zinc oxide (ITZO).

The gate insulating layer 22 covers the active layer 41 and the second barrier layer 21. Of course, when the first stacked layer 20 further includes the buffer layer 24, the gate insulating layer 22 covers the active layer 41 and the buffer layer 24. Optionally, a material of the gate insulating layer 22 may also include inorganic materials, such as silicon oxide, silicon nitride, or silicon oxynitride.

The gate electrode 42 of the transistors 40 is disposed on the gate insulating layer 22, and the gate electrode 42 is disposed corresponding to the channel of the active layer 41. Of course, while forming the gate electrode 42, other signal lines such as the gate scanning lines disposed on the same layer as the gate electrode 42 may also be formed, and the gate scanning lines are located in the wiring areas LA. Wherein, the gate electrode 42 is electrically connected to the gate scanning lines.

It should be noted that in the present disclosure, "disposed on the same layer" means that in the preparation process, the film layers formed of the same material are patterned to obtain at least two different features, and the at least two different features are disposed on the same layer. For example, in this embodiment, the gate electrode 42 and the gate scanning lines are obtained by patterning a same conductive film layer, so the gate electrode 42 and the gate scanning lines are disposed on the same layer.

The interlayer insulating layer 23 covers the gate electrode 42 and the gate insulating layer 22, and the source electrode 43 and the drain electrode 44 of the transistors 40 are disposed on the interlayer insulating layer 23. A material of the interlayer insulating layer 23 may also include inorganic materials, such as silicon oxide, silicon nitride, or silicon oxynitride.

The source electrode 43 of the transistors 40 is electrically connected to the source region of the active layer 41, and the drain electrode 44 of the transistors 40 is electrically connected to the drain region of the active layer 41. Of course, when the source electrode 43 and the drain electrode 44 are formed, the signal lines such as the data lines and the power lines (such as VDD, etc.) disposed on the same layer as the source electrode 43 and the drain electrode 44 may also be formed, and the data lines and the power lines are also located in the wiring areas LA. The data lines may be electrically connected to the source electrode 43 of the transistors 40.

The second stacked layer 30 and the light-emitting units are disposed on the first stacked layer 20 and the transistors 40. The second stacked layer 30 includes a planarization layer 32 disposed on the first stacked layer 20 and a pixel definition layer 33 disposed on one side of the planarization layer 32 away from the first stacked layer 20. Pixel openings 331 are formed on the pixel definition layer 33 corresponding to the pixel areas PA, and the light-emitting units are located in the pixel openings 331.

Specifically, the planarization layer 32 covers the source electrode 43, the drain electrode 44, and the interlayer insulating layer 23, and the planarization layer 32 has a substantially flat or horizontal top surface. Optionally, a material of the planarization layer 32 includes organic materials, such as polyimide, epoxy resins, acryloyl resins, or polyesters.

The first electrode 51 of the light-emitting units is disposed on the planarization layer 32, and the first electrode 51 is electrically connected to the drain electrode 44 of the transistors 40 by a through-hole of the planarization layer 32. The first electrode 51 corresponds to the pixel openings 331, and the pixel openings 331 expose part of the first electrode 51.

Optionally, the first electrode 51 may be a transparent electrode or a reflective electrode, and if the first electrode 51 is a transparent electrode, the first electrode 51 may be formed of, for example, indium tin oxide (ITO), indium zinc oxide (IZO), ZnO, or $In_2O_3$. If the first electrode 51 is a reflective electrode, the first electrode 51 may include, for example, a reflective layer formed of Ag, Mg, Al, Pt, Pd, Au, Ni, Nd, Ir, Cr, or a combination thereof, and a layer formed of ITO, IZO, ZnO, or $In_2O_3$. However, the first electrode 51 is not limited thereto, and the first electrode 51 may be formed by various materials, and may also be formed in a single-layer or multi-layer structure.

The pixel definition layer 33 covers the planarization layer 32 and the first electrode 51. The pixel definition layer 33 is provided with the pixel openings 331 at positions corresponding to the first electrode 51, and the pixel openings 331 expose part of the first electrode 51. Optionally, a material of the pixel definition layer 33 may include a transparent organic material of polyimide or acryloyl resins.

While forming the pixel openings 331 on the pixel definition layer 33 in the pixel areas PA, the openings 31 are formed on the pixel definition layer 33 in the transparent areas TA. The openings 31 penetrate through the second stacked layer 30, the first stacked layer 20, and the part of the first substrate 11 in sequence. It can be understood that in a direction perpendicular to a plane where the base substrate 10 is located, since a depth of the pixel openings 331 is much less than a depth of the openings 31, more process steps are required when forming the openings 31. The plane where the base substrate 10 is located refers to a plane where a surface of the base substrate 10 facing the first stacked layer 20 is located.

Specifically, each of the openings 31 includes a first sub-hole 311, a second sub-hole 312, and a third sub-hole 313 intercommunicated to each other, the first sub-hole 311 penetrates through the second stacked layer 30, the second sub-hole 312 penetrates through the first stacked layer 20, and the third sub-hole 313 penetrates through at least the part of the base substrate 10. To be more specific, the first sub-hole 311 penetrates through the pixel definition layer 33 and the planarization layer 32 in sequence. The second sub-hole 312 penetrates through the interlayer insulating layer 23, the gate insulating layer 22, the buffer layer 24, and the second barrier layer 21 in sequence. The third sub-hole 313 penetrates through the part of the first substrate 11.

Optionally, referring to FIG. 3, in the direction perpendicular to the plane where the base substrate 10 is located, cross-sectional shapes of the first sub-hole 311 and the second sub-hole 312 include an inverted trapezoid, and a cross-sectional shape of the third sub-hole 313 includes a rectangle. The cross-sectional shape of the third sub-hole 313 is not limited to this. By setting the first sub-hole 311 and the second sub-hole 312 in an inverted trapezoid shape, it will facilitate subsequent climbing of film layers prepared in the openings 31.

An opening size D1 of one side of the first sub-hole 311 adjacent to the second sub-hole 312 is greater than an opening size D2 of one side of the second sub-hole 312 adjacent to the first sub-hole 311, thereby simplifying processes. It can be understood that under a same process condition, etching of organic film layer is easier than etching of inorganic film layer. The opening of the first sub-hole 311 and the opening of the second sub-hole 312 may be designed differently, so the same process condition can be used, thereby simplifying the processes. The opening size of the opening of each sub-hole (taking the first sub-hole 311 as an example) refers to a maximum length of the opening of each sub-hole in a direction parallel to the plane where the base substrate 10 is located. For example, when a shape of the opening of each sub-hole is circular, the opening size of the opening may be a diameter of the circle, and when the shape of the opening of each sub-hole is square, the opening size of the opening may be a length of a diagonal of the square.

Further, an opening size D4 of one side of the third sub-hole 313 adjacent to the first stacked layer 20 is greater than an opening size D3 of one side of the second sub-hole 312 adjacent to the base substrate 10. Therefore, the openings 31 form an undercut structure between the first stacked layer 20 and the base substrate 10. Similarly, the second sub-hole 312 is formed by etching the first stacked layer 20, the third sub-hole 313 is formed by etching the first substrate 11, and the first substrate 11 is formed of an organic material. In this way, by adjusting dry etching processes, the second sub-hole 312 and the third sub-hole 313 are formed by utilizing a difference in the etching rates of the organic film layer and the inorganic film layer, thereby forming the openings 31 having the undercut structure.

The undercut structure of the openings 31 enables the organic auxiliary layer 53 in the light-emitting units to be disconnected at the undercut structure, thereby cutting off a path of water and oxygen from entering the light-emitting units through the organic auxiliary layer 53 of the light-emitting units. Therefore, the light-emitting layer 52 in the light-emitting units can be protected and prevented from losing effectiveness caused by intrusion of water and oxygen.

Specifically, the light-emitting layer 52 is disposed in the pixel openings 331, and the light-emitting layer 52 is formed by light-emitting materials printed in the pixel openings 331. Light-emitting materials having different colors form light-emitting layers 52 having different colors. For example, the light-emitting layer 52 may include a red light-emitting layer formed by a red light-emitting material, a green light-emitting layer formed by a green light-emitting material, and a blue light-emitting layer formed by a blue light-emitting material. The red light-emitting layer emits red light, the green light-emitting layer emits green light, and the blue light-emitting layer emits blue light.

Of course, in order to realize light emission of the light-emitting units, the second electrode 54 disposed opposite to the first electrode 51 is also required. The second electrode 54 is disposed on one side of the light-emitting layer 52 away from the first electrode 51. Specifically, the second electrode 54 covers the light-emitting layer 52 and the pixel definition layer 33, extends to the transparent areas TA, and is defined with gaps corresponding to the openings 31, thereby further improving the transmittance in the transparent areas TA. The light-emitting layer 52 emits light under the combined action of the first electrode 51 and the second electrode 54, and the light-emitting layers 52 having different colors emit light of different colors, thereby realizing color display of the display panel 100. In the embodiment of the present disclosure, the first electrode 51 is an anode, and the second electrode 54 is a cathode. Of course, the present disclosure is not limited to this, the first electrode 51 may also be the cathode, and correspondingly, the second electrode 54 may be the anode.

The organic auxiliary layer 53 is disposed on one side of the light-emitting layer 52 adjacent to the planarization layer 32. Specifically, the organic auxiliary layer 53 is disposed between the light-emitting layer 52 and the first electrode 51. The organic auxiliary layer 53 covers the first electrode 51 and the pixel definition layer 33, and also extends into the openings 31 in the transparent areas TA and is disconnected between the first stacked layer 20 and the base substrate 10. That is, the organic auxiliary layer 53 is disconnected at the undercut structure of the openings 31.

Optionally, the organic auxiliary layer 53 includes a hole transport layer (HTL) or a stack of a hole injection layer (HIL) and the hole transport layer (HTL). Of course, the organic auxiliary layer 53 may further include an electron injection layer (EIL) and an electron transport layer (ETL) between the light-emitting layer 52 and the second electrode 54. The hole injection layer receives holes transmitted from the first electrode 51, the holes are transmitted to the light-emitting layer 52 by the hole transport layer, the electron injection layer receives electrons transmitted from the second electrode 54, the electrons are transmitted to the light-emitting layer 52 by the electron transport layer, and the holes and the electrons combine in the light-emitting layer 52 to generate excitons, and the excitons transition from the excited state to the ground state to release energy and emit light.

Further, in order to prevent the light-emitting layer 52 from being intruding by water and oxygen and losing effectiveness, the display panel 100 further includes an encapsulation layer 60 disposed on one side of the light-emitting units away from the base substrate 10. The encapsulation layer 60 includes a first sub-encapsulation layer 61 and a second sub-encapsulation layer 62 disposed in a stack. The first sub-encapsulation layer 61 is an inorganic encapsulation layer, and the second sub-encapsulation layer 62 is an organic encapsulation layer. The first sub-encapsulation layer 61 extends into the openings 31 and covers the organic auxiliary layer 53, and the second sub-encapsulation layer 62 is filled in the openings 31. Of course, in order to improve the encapsulation effect of the encapsulation layer 60, the encapsulation layer 60 may further include more sub-encapsulation layers. For example, the encapsulation layer 60 may further include a third sub-encapsulation layer 63, the third sub-encapsulation layer 63 covers the second sub-encapsulation layer 62, and the third sub-encapsulation layer 63 is an inorganic encapsulation layer.

In the openings 31, the first sub-encapsulation layer 61 covers the organic auxiliary layer 53 and fills a position where the organic auxiliary layer 53 is disconnected in the openings 31, so that the organic auxiliary layer 53 located in the first sub-hole 311 and the second sub-hole 312 can be disconnected between the base substrate 10 and the first stacked layer 20. Therefore, water and oxygen in the base substrate 10 or external water and oxygen passing through the base substrate 10 can be prevented from entering the light-emitting units through the organic auxiliary layer 53 and causing the light-emitting units to lose effectiveness.

The second sub-encapsulation layer 62 covers the first sub-encapsulation layer 61 and is filled in the openings 31. The light transmittance of the second sub-encapsulation layer 62 is greater than the light transmittance of the second stacked layer 30 and the first stacked layer 20. By forming the openings 31 in the transparent areas TA to remove the second stacked layer 30, the first stacked layer 20, and the part of the first substrate 11 and filling the second sub-encapsulation layer 62 in the openings 31, the transparent areas TA can have a better transmittance, thereby improving the transmittance in the transparent areas TA.

In an embodiment of the present disclosure, referring to FIGS. 1 to 4, FIG. 4 is another schematic cross-sectional structural diagram of the display panel according to an embodiment of the present disclosure. Different from the above-mentioned embodiment, in the display panel 101 of this embodiment, the base substrate 10 includes a first substrate 11 and a second substrate 12. The first stacked layer 20 is disposed on the first substrate 11, the second substrate 12 is disposed on one side of the first substrate 11 away from the first stacked layer 20, and the third sub-hole 313 penetrates through the first substrate 11 and exposes part of the second substrate 12. In this way, while improving the transmittance in the transparent areas TA, the third sub-hole 313 with a deeper depth can also be set, which is beneficial to the setting of the first sub-encapsulation layer 61 in the openings 31. Furthermore, by using a double-layered substrate, the supporting performance of the base substrate 10 on the first stacked layer 20 and the second stacked layer 30 can be improved. Optionally, a material of the second substrate 12 may be the same as that of the first substrate 11.

In an embodiment of the present disclosure, the base substrate 10 further includes a first barrier layer 13 disposed between the first substrate 11 and the second substrate 12, and the third sub-hole 313 penetrates through the first substrate 11 and exposes part of the first barrier layer 13. The first barrier layer 13 can prevent undesired impurities or contaminants (eg, moisture, oxygen, etc.) from diffusing from the second substrate 12 into the devices that may be damaged by these impurities or contaminants. Optionally, a material of the first barrier layer 13 may be the same as the material of the second barrier layer 21, for example, the material of the first barrier layer 13 may include inorganic materials, such as silicon oxide (SiOx), silicon nitride (SiNx), or silicon oxynitride (SiON).

In addition, the structure of the transistor 40 is different from the above-mentioned embodiment, and the transistor 40 in this embodiment adopts a double-gate structure. Specifically, the gate electrode 42 includes a first gate electrode 42-1 and a second gate electrode 42-2, and correspondingly, the gate insulating layer 22 also includes a first gate insulating layer 22-1 and a second gate insulating layer 22-2. The first gate insulating layer 22-1 covers the active layer 41 and the buffer layer 24, and the first gate electrode 42-1 is disposed on the first gate insulating layer 22-1 and corresponds to the channel of the active layer 41. The second gate insulating layer 22-2 covers the first gate electrode 42-1 and the first gate insulating layer 22-1, and the second gate electrode 42-2 is disposed on the second gate insulating layer 22-2 and corresponds to the first gate electrode 42-1. The interlayer insulating layer 23 covers the second gate electrode 42-2 and the second gate insulating layer 22-2. It should be noted that the structure of the transistor 40 of the present disclosure is not limited to the examples in the above embodiments, for example, the transistors 40 in the present disclosure may also adopt a bottom gate structure. For other details, please refer to the above-mentioned embodiments, and will not be repeated here.

In an embodiment, referring to FIGS. 1 to 5, FIG. 5 is yet another schematic cross-sectional structural diagram of the display panel according to an embodiment of the present disclosure. Different from the above embodiments, the display panel 102 further includes a transparent filler 70 filled in the openings 31, and the encapsulation layer 60 covers the transparent filler 70. Specifically, the first sub-encapsulation layer 61 covers the organic auxiliary layer 53 in the openings 31 to cut off the intrusion path of water and oxygen of the organic auxiliary layer 53. The transparent filler 70 is filled in the openings 31 and covers the first sub-encapsulation layer 61 in the openings 31. The second sub-encapsulation layer 62 covers the first sub-encapsulation layer 61 and the transparent filler 70, and the third sub-encapsulation layer 63 covers the second sub-encapsulation layer 62. The light transmittance of the transparent filler 70 is greater than that of the first stacked layer 20 and the second stacked layer 30. Optionally, the transparent filler 70 includes a transparent material, such as an OCA optical adhesive. By forming the openings 31 in the transparent areas TA and filling the transparent filler 70 in the openings 31, the transmittance in the transparent areas TA is improved. For other details, please refer to the above-mentioned embodiments, and will not be repeated here.

Based on the same inventive concept, an embodiment of the present disclosure further provides an electronic device. The electronic device includes the display panel in one of the embodiments mentioned above, thereby realizing transparent display. The electronic device includes electronic products such as televisions and can be applied to scenes such as car window displays and glass curtain walls.

It can be known according to the above embodiments:

the present disclosure provides the display panel and the electronic device. The display panel has the pixel areas and the transparent areas disposed between the pixel areas, and the display panel further includes the first stacked layer and the second stacked layer disposed on the base substrate. Wherein, the openings are defined on the second stacked layer corresponding to the transparent areas, and the openings penetrate the second stacked layer, the first stacked layer, and at least part of the base substrate. In the present disclosure, the first stacked layer in the transparent areas is removed by forming the openings in the transparent areas. Therefore, the transmittance in the transparent areas is improved, thereby solving the problem of poor transmittance in current transparent display screens.

In the above embodiments, the description of each embodiment has its own emphasis. For a part that is not described in detail in an embodiment, refer to the related descriptions of other embodiments.

The embodiments of the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display panel, having pixel areas and transparent areas located between the pixel areas and comprising:
   a base substrate;
   a first stacked layer disposed on the base substrate; and
   a second stacked layer disposed on one side of the first stacked layer away from the base substrate;
   wherein openings are defined on the second stacked layer corresponding to the transparent areas, each of the openings comprises a first sub-hole, a second sub-hole, and a third sub-hole intercommunicated to each other, the first sub-hole penetrates through the second stacked layer, the second sub-hole penetrates through the first stacked layer, and the third sub-hole penetrates through at least the part of the base substrate;
   wherein the second stacked layer comprises a planarization layer disposed on the first stacked layer and a pixel definition layer disposed on one side of the planarization layer away from the first stacked layer, and pixel openings are defined on the pixel definition layer corresponding to the pixel areas;
   wherein the display panel further comprises:
   a first electrode disposed on the planarization layer in the pixel areas, wherein the pixel openings expose part of the first electrode;
   an organic auxiliary layer covering the pixel definition layer, walls of the pixel openings and the first electrode;
   a light-emitting layer disposed in the pixel openings; and
   a second electrode disposed on a top surface of the light-emitting layer and a top surface of a part of the organic auxiliary layer covering the pixel definition layer; wherein the top surface of the light-emitting layer, the top surface of the part of the organic auxiliary layer covering the pixel definition layer, and a bottom surface of the second electrode layer line along a same plane; wherein the second electrode extends to the transparent areas and is defined with gaps corresponding to the openings;
   wherein the organic auxiliary layer extends into the openings in the transparent areas and is disconnected between the first stacked layer and the base substrate, and the organic auxiliary layer covers a first sidewall of the first sub-hole, a second sidewall of the second sub-hole, a third sidewall of the third sub-hole, and a bottom of the third sub-hole.

2. The display panel according to claim 1, wherein an opening size of one side of the third sub-hole adjacent to the first stacked layer is greater than an opening size of one side of the second sub-hole adjacent to the base substrate.

3. The display panel according to claim 1, wherein an opening size of one side of the first sub-hole adjacent to the second sub-hole is greater than an opening size of one side of the second sub-hole adjacent to the first sub-hole.

4. The display panel according to claim 1, wherein the base substrate comprises a first substrate disposed adjacent to the first stacked layer, the first stacked layer is disposed on the first substrate, and the third sub-hole penetrates at least part of the first substrate.

5. The display panel according to claim 1, wherein the base substrate comprises a first substrate and a second substrate, the first stacked layer is disposed on the first substrate, the second substrate is disposed on one side of the first substrate away from the first stacked layer, and the third sub-hole penetrates through the first substrate and exposes part of the second substrate.

6. The display panel according to claim 1, wherein the base substrate further comprises a first substrate, a second substrate, and a first barrier layer disposed between the first substrate and the second substrate, and the third sub-hole penetrates through the first substrate and exposes part of the first barrier layer.

7. The display panel according to claim 1, wherein the display panel further comprises an encapsulation layer disposed on one side of the second electrode away from the light-emitting layer.

8. The display panel according to claim 7, wherein the encapsulation layer comprises a first sub-encapsulation layer and a second sub-encapsulation layer disposed in a stack, the first sub-encapsulation layer extends into the openings and covers the organic auxiliary layer, and the second sub-encapsulation layer is filled in the openings.

9. The display panel according to claim 7, wherein the display panel further comprises a transparent filler filled in the openings, and the encapsulation layer covers the transparent filler.

10. An electronic device, comprising a display panel having pixel areas and transparent areas located between the pixel areas, wherein the display panel comprises:
   a base substrate;
   a first stacked layer disposed on the base substrate; and
   a second stacked layer disposed on one side of the first stacked layer away from the base substrate;
   wherein openings are defined on the second stacked layer corresponding to the transparent areas, each of the openings comprises a first sub-hole, a second sub-hole, and a third sub-hole intercommunicated to each other, the first sub-hole penetrates through the second stacked layer, the second sub-hole penetrates through the first stacked layer, and the third sub-hole penetrates through at least the part of the base substrate;
   wherein the second stacked layer comprises a planarization layer disposed on the first stacked layer and a pixel definition layer disposed on one side of the planarization layer away from the first stacked layer, and pixel openings are defined on the pixel definition layer corresponding to the pixel areas;
   wherein the display panel further comprises:
   a first electrode disposed on the planarization layer in the pixel areas, wherein the pixel openings expose part of the first electrode;
   an organic auxiliary layer covering the pixel definition layer, walls of the pixel openings and the first electrode;
   a light-emitting layer disposed in the pixel openings; and
   a second electrode disposed on a top surface of the light-emitting layer and a top surface of a part of the organic auxiliary layer covering the pixel definition layer; wherein the top surface of the light-emitting layer, the top surface of the part of the organic auxiliary layer covering the pixel definition layer, and a bottom surface of the second electrode layer line along a same plane; wherein the second electrode extends to the transparent areas and is defined with gaps corresponding to the openings;
   wherein the organic auxiliary layer extends into the openings in the transparent areas and is disconnected between the first stacked layer and the base substrate; and the organic auxiliary layer covers a first sidewall of the first sub-hole, a second sidewall of the second sub-hole, a third sidewall of the third sub-hole, and a bottom of the third sub-hole.

11. The electronic device according to claim 10, wherein an opening size of one side of the third sub-hole adjacent to the first stacked layer is greater than an opening size of one side of the second sub-hole adjacent to the base substrate.

12. The electronic device according to claim 10, wherein an opening size of one side of the first sub-hole adjacent to the second sub-hole is greater than an opening size of one side of the second sub-hole adjacent to the first sub-hole.

13. The electronic device according to claim 10, wherein the base substrate comprises a first substrate disposed adjacent to the first stacked layer, the first stacked layer is disposed on the first substrate, and the third sub-hole penetrates at least part of the first substrate.

14. The electronic device according to claim 10, wherein the base substrate comprises a first substrate and a second substrate, the first stacked layer is disposed on the first substrate, the second substrate is disposed on one side of the first substrate away from the first stacked layer, and the third sub-hole penetrates through the first substrate and exposes part of the second substrate.

15. The electronic device according to claim 10, wherein the base substrate further comprises a first substrate, a second substrate, and a first barrier layer disposed between the first substrate and the second substrate, and the third sub-hole penetrates through the first substrate and exposes part of the first barrier layer.

16. The electronic device according to claim 10, wherein the display panel further comprises an encapsulation layer disposed on one side of the second electrode away from the light-emitting layer.

\* \* \* \* \*